United States Patent
Gasbarro et al.

[11] Patent Number: 5,268,639
[45] Date of Patent: Dec. 7, 1993

[54] TESTING TIMING PARAMETERS OF HIGH SPEED INTEGRATED CIRCUIT DEVICES

[75] Inventors: James A. Gasbarro, Mountain View; Mark A. Horowitz, Palo Alto, both of Calif.

[73] Assignee: Rambus, Inc., Mountain View, Calif.

[21] Appl. No.: 894,525

[22] Filed: Jun. 5, 1992

[51] Int. Cl.⁵ .................................... G01R 31/00
[52] U.S. Cl. ............................. 324/158 R; 371/25.1
[58] Field of Search .................... 324/73.1, 158 R; 368/113, 118; 371/1, 25.1, 27, 21.2

[56] References Cited

U.S. PATENT DOCUMENTS

| | | | |
|---|---|---|---|
| 4,247,817 | 1/1981 | Heller | 371/27 |
| 4,481,625 | 11/1984 | Roberts et al. | 370/85.1 |
| 4,519,034 | 5/1985 | Smith et al. | 395/550 |
| 4,785,394 | 11/1988 | Fischer | 395/325 |
| 4,811,202 | 3/1989 | Schabowski | 395/325 |
| 4,860,198 | 8/1989 | Takenaka | 395/325 |
| 4,878,209 | 10/1989 | Bassett et al. | 368/113 |
| 4,893,072 | 1/1990 | Matsumoto | 371/25.1 |
| 4,929,888 | 5/1990 | Yoshida | 371/1 |
| 5,083,299 | 1/1992 | Schwanke et al. | 324/73.1 |

FOREIGN PATENT DOCUMENTS 9102590 4/1991 PCT Int'l Appl. .

*Primary Examiner*—Vinh Nguyen
*Attorney, Agent, or Firm*—Blakely, Sokoloff, Taylor & Zafman

[57] ABSTRACT

A method and apparatus for testing input and output parameters for high speed integrated circuit devices. An integrated circuit tester generates a receive clock and a transmit clock using a pair of pre-selected output pins. The integrated circuit tester adjusts the phase relation between the transmit clock and the receive clock. Special circuitry within the device under test compares input and output data to detect errors.

5 Claims, 8 Drawing Sheets

| Bus Cycle | 7 | 6 | 5 | 4 | 3 | 2 | 1 | 0 |
|---|---|---|---|---|---|---|---|---|
| 7..0 | 0 | 0 | 1 | 1 | 1 | 0 | 1 | 1 |
| 15..8 | 0 | 1 | 0 | 0 | 0 | 1 | 0 | 0 |
| 23..16 | 1 | 0 | 1 | 0 | 0 | 0 | 1 | 0 |
| 31..24 | 1 | 1 | 0 | 1 | 1 | 1 | 0 | 1 |
| 39..32 | 0 | 0 | 1 | 0 | 1 | 0 | 1 | 0 |
| 47..40 | 1 | 1 | 0 | 1 | 0 | 1 | 0 | 1 |
| 55..48 | 0 | 0 | 1 | 1 | 1 | 0 | 0 | 1 |
| 63..56 | 0 | 1 | 1 | 0 | 0 | 0 | 0 | 0 |

Columns 7–5: Input Data; Columns 2–0: Output Data

FIGURE 10

TESTING TIMING PARAMETERS OF HIGH SPEED INTEGRATED CIRCUIT DEVICES

FIELD OF THE INVENTION

The present invention pertains to the field of integrated circuit device testing. More particularly, this invention relates to testing input and output timing parameters of high speed integrated circuit devices.

BACKGROUND OF THE INVENTION

Integrated circuit devices typically transmit and receive information synchronous with clock signals. Typically, transitions of a clock signal indicate that valid information is available on a signal line or set of signal lines coupled to the integrated circuit device. The clock signals that synchronize information transfer must satisfy input and output timing parameters for the integrated circuit device.

The integrated circuit device typically has a specified input setup time ($t_{SU}$) and input hold time ($t_H$). Input data must be present and stable on the device input pins from at least $t_{SU}$ before the clock transition and until at least $t_H$ after clock transition for proper operation. Also, the integrated circuit device typically has a specified minimum propagation time from clock to output ($t_{CLK-Q}$). Output data is not valid on the output pins of the device until at least $t_{CLK-Q}$ after the clock transition.

The input and output timing parameters of an integrated circuit device typically must be tested to ensure proper operation of the device in a high speed system. Limitations in the measurement capability of test equipment, however, can in some cases cause inaccuracies in timing measurements. The inaccuracies typically can create a band of uncertainty for the input and output timing parameters of a device. Devices having measured timing parameters within the band of uncertainty are typically rejected, even though the devices would meet the required timing parameters if the test equipment were more accurate.

For example, test equipment having an overall timing accuracy of 800 picoseconds (ps) is typically sufficient to measure devices for a system having a cycle time of 50 nanoseconds (ns). Unfortunately, such test equipment performance is insufficient for devices having a 2 ns cycle time. An overall timing accuracy of 800 ps creates measurement inaccuracies equivalent to 40% of the 2 ns cycle time. The high level of inaccuracy results in a high rate of improper rejection of devices.

SUMMARY AND OBJECTS OF THE INVENTION

One object of the present invention is to test input and output timing parameters for high speed integrated circuit devices.

Another object of the present invention is to test input and output timing parameters of high speed integrated circuit devices in order to minimize improper rejection of devices.

Another object of the present invention is to test input and output timing parameters of high speed integrated circuit devices wherein data is transferred on both rising and falling edges of clock signals.

Another object of the present invention is to test input and output timing parameters of high speed integrated circuits using test equipment having relatively low overall timing accuracy specifications.

A further object of the present invention is to test setup time, hold time, and clock to output time for high speed random access memory circuits.

These and other objects of the invention are provided by a method and apparatus for testing input and output parameters for high speed integrated circuit devices.

An output parameter test pattern is stored in the integrated circuit device. An integrated circuit tester generates a receive clock and a transmit clock using a pair of pre-selected output pins. The transmit clock is coupled to a transmit clock input of the integrated circuit device. The transmit clock causes the integrated circuit device to generate an output data pattern by transmitting the output parameter test pattern over a set of bus data pins.

The receive clock is coupled to a receive clock input of the integrated circuit device. The receive clock causes the integrated circuit device to generate an input data pattern by sampling the bus data pins. The integrated circuit tester adjusts the phase relation between the transmit clock and the receive clock. Error logic circuitry in the integrated circuit device compares the input data pattern with the output data pattern to determine the output parameters.

Other objects, features and advantages of the present invention will be apparent from the accompanying drawings, and from the detailed description that follows below.

BRIEF DESCRIPTION OF THE DRAWINGS

The present invention is illustrated by way of example and not limitation in the figures of the accompanying drawings in which like references indicate similar elements, and in which:

FIG. 10 shows a bit table of an example output parameter test pattern that corresponds to a bus data pin.

DETAILED DESCRIPTION

Figure 1:
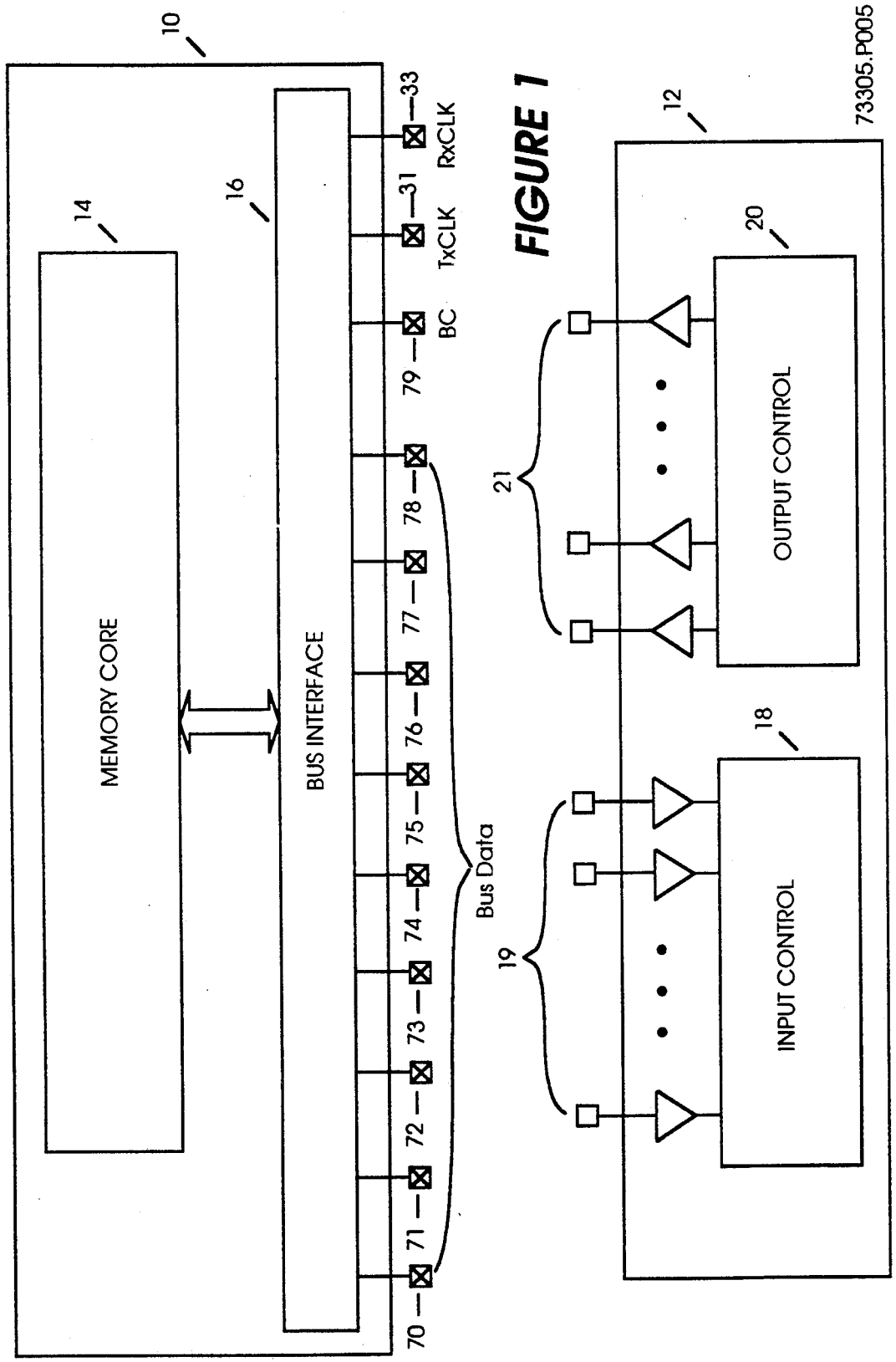
FIG. 1 illustrates an example integrated circuit device, and an example device tester.

FIG. 1 illustrates an integrated circuit device 10, and a device tester 12. For one embodiment, the integrated circuit device 10 is a random access memory circuit, which is comprised of a memory core 14 and a bus interface 16. The memory core 14 is a dynamic random access memory array.

The bus interface 16 is coupled to transmit and receive data over a set of bus data pins 70-78. The bus data pins 70-78 comprise nine bits of data. The bus interface 16 is also coupled to transmit and receive a bus control/bus enable signal (BC) over a bus pin 79. The bus interface 16 is coupled to receive a transmit clock (TxCLK) over a bus pin 31 and a receive clock (RxCLK) over a bus pin 33.

The device tester 12 represents a wide variety of integrated circuit testers, such as the ADVANTEST model number T5381, manufactured by Advantest of America, 300 Knightsbridge Parkway, Lincolnshire, Ill.

The tester 12 and the device 10 communicate using a block oriented communication protocol. The communication protocol comprises three types of communication packets: a request packet, an acknowledge packet, and a data packet. The combination of a request packet, an acknowledge packet, and a data packet constitutes a communication transaction. The following types of transactions are defined: read memory space, write memory space, read register space, write register space, and broadcast write register space.

Figure 2:
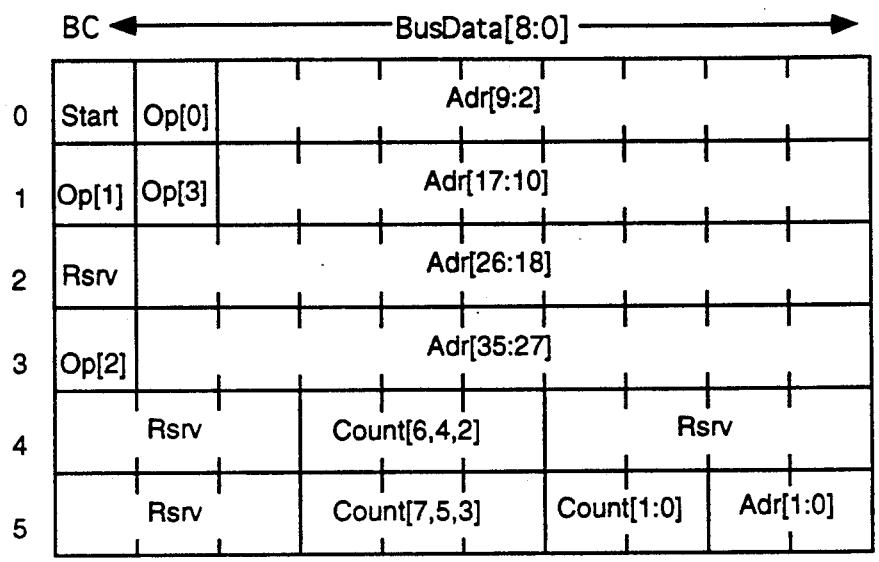
FIG. 2 illustrates the format of the request packet, which contains a start bit (start), an opcode(Op[3:0]), an address(Adr[35:0]), and a count(Count[7:0])

FIG. 2 illustrates the format of the request packet, which contains a start bit (start), an opcode(Op[3:0]), an address (Adr[35:0 ]), and a count(Count[7:0]). The opcode specifies the type of data transfer requested. The device 10 contains both a memory space and a register space. The 36 bit Adr specifies the first byte for transfer. The 8 bit Count enables transfers from 1 byte to 256 bytes in a single transaction.

Figure 3:
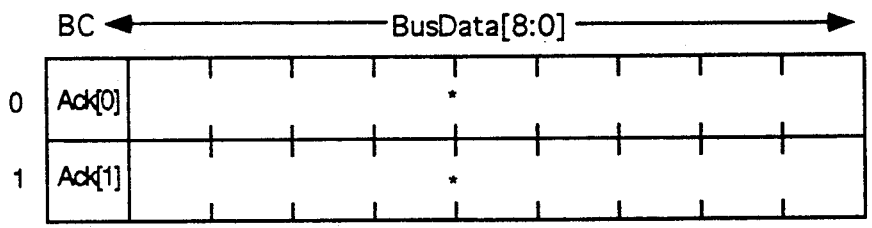
FIG. 3 illustrates the format of an acknowledge packet, which the device transmits in response to a request packet targeted for the device.

FIG. 3 illustrates the format of an acknowledge packet, which the device 10 transmits in response to a request packet targeted for the device 10. The device 10 transmits the acknowledge through the BC pin 79. The device 10 may transmit the acknowledge concurrent with a data packet. The Ack[1:0] indicates the addressed device does not exist, or "Okay" the device will respond to the request, or "Nack" the device is busy.

Figure 4:
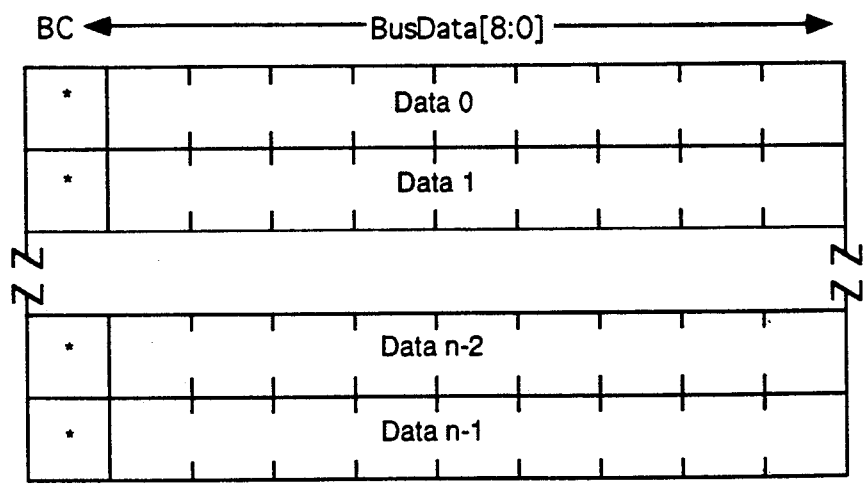
FIG. 4 illustrates the format of a data packet, which contains from 1 to 256 bytes of data.

FIG. 4 illustrates the format of a data packet, which contains from 1 to 256 bytes of data. During a read transaction, the data packet is transmitted by the device 10, and during a write transaction, the data packet is transmitted by the tester 12.

For a detailed discussion of an example random access memory circuit and communication protocol, refer to PCT international patent application number PCT/US91/02590 filed Apr. 16, 1991, published Oct. 31, 1991, and entitled Integrated Circuit I/O Using A High Performance Bus Interface.

The tester 12 generates output signals through a set of output pins 21 to measure the input and output parameters of the device 10. The tester 12 has an output control circuit 20 for controlling output signal timing and for controlling the output modes for the output pins 21. The tester 12 also has an input control circuit 18 and a set of input pins 19 for receiving input signals.

To communicate with the device 10, the tester 12 generates the request packets, transmits data packets, receives data packets, and receives acknowledge packets in accordance with the communication protocol discussed above.

Figure 5:
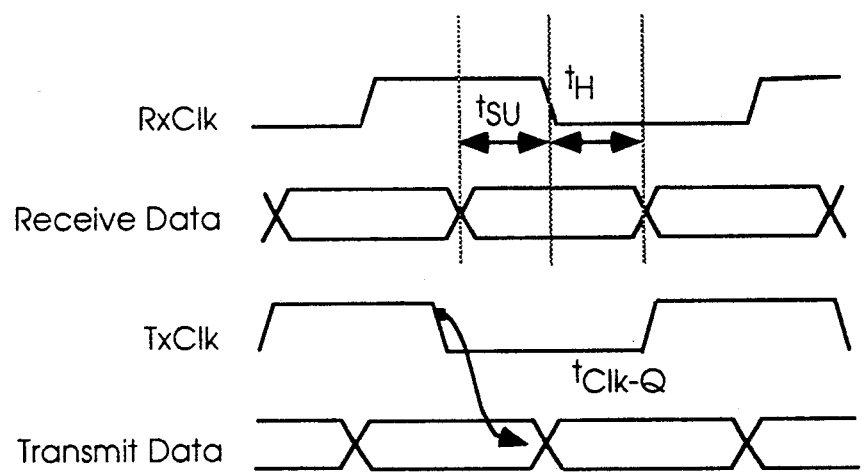
FIG. 5 illustrates the three timing parameters, $t_{SU}$, $t_H$, and $t_{CLK-Q}$, that are tested to ensure correct operation of the device in a high speed memory system.

FIG. 5 illustrates the three timing parameters, $t_{SU}$, $t_H$, and $t_{CLK-Q}$, that are tested to ensure correct operation of the device 10 in a high speed memory system. The RxCLK synchronizes the RECEIVE DATA signal, and the TxCLK synchronizes the TRANSMIT DATA signal. The RxCLK, the TxCLK, and the RECEIVE DATA signal are generated by the tester 12 for measuring input and output timing parameters of the device 10. The TRANSMIT DATA signal is generated by the device 10 for measuring output timing parameters.

The edges of the RxCLK are nominally centered in the data windows of a RECEIVE DATA signal. The RECEIVE DATA signal is received by the device 10 over the bus data pins 70-78 during a write transaction targeted for the device 10. The RECEIVE DATA signal has a 2 ns period and is clocked by both the rising and falling edges of the RxCLK. The nominal value for $t_{SU}$ and $t_H$ is 1 ns.

The edges of the TxCLK are centered in the data windows of a TRANSMIT DATA signal. The TRANSMIT DATA signal is transmitted by the device 10 over the bus data pins 70-78 in response to a read transaction targeted for the device 10. The TRANSMIT DATA signal has a 2 ns period and is clocked by both the rising and falling edges of the TxCLK. The nominal value for $t_{CLK-Q}$ is 1 ns.

For one embodiment, the tester 12 has an overall timing accuracy of plus or minus 400 picoseconds (ps). The overall timing accuracy indicates the accuracy that tester 12 can measure the response to a signal generated by the tester 12. Accuracy specifications for the tester 12 discussed herein are provided for purposes of example. However, the present method and apparatus does not require the tester 12 have the specifications described herein.

The overall timing accuracy of 400 ps is equivalent to 800 ps of uncertainty for measurements by the tester 12. The uncertainty of 800 ps is 40% of the bus cycle time for communication with the device 10. It will be appreciated that the 800 ps level of uncertainty renders the tester 12 unsuitable for testing input and output parameters for the device 10.

On the other hand, the output accuracy of the tester 12 is plus or minus 150 ps. The output accuracy specifies the uncertainty in the relative phase difference between any two output signals generated by the tester 12. Also, the output accuracy of the tester 12 improves to 100 ps if delayed non return to zero (DNRZ) output mode is selected for the outputs 21. Moreover, the output accuracy may be improved if two of the outputs 21 are carefully chosen in order to maximize the output accuracy.

Improvement in the output accuracy of the tester 21 decreases the likelihood that the device 10 will be improperly rejected and thereby increases the yield in device testing. As an example, assume the nominal setup time for input signals on the bus data pins 70-78 is 500 ps. If the output accuracy for the tester 12 is plus or minus 150 ps, then a 300 ps uncertainty exists between signals generated by the tester 12. It will be appreciated that the device 10 is required to have a measured setup time of 200 ps maximum in order to ensure proper performance in a system that requires a maximum of 500 ps setup time. However, if the output accuracy improved to plus or minus 100 ps, then the device 10 can be accepted with up to a 300 ps measured setup time, which increases device testing yield.

Figure 6:
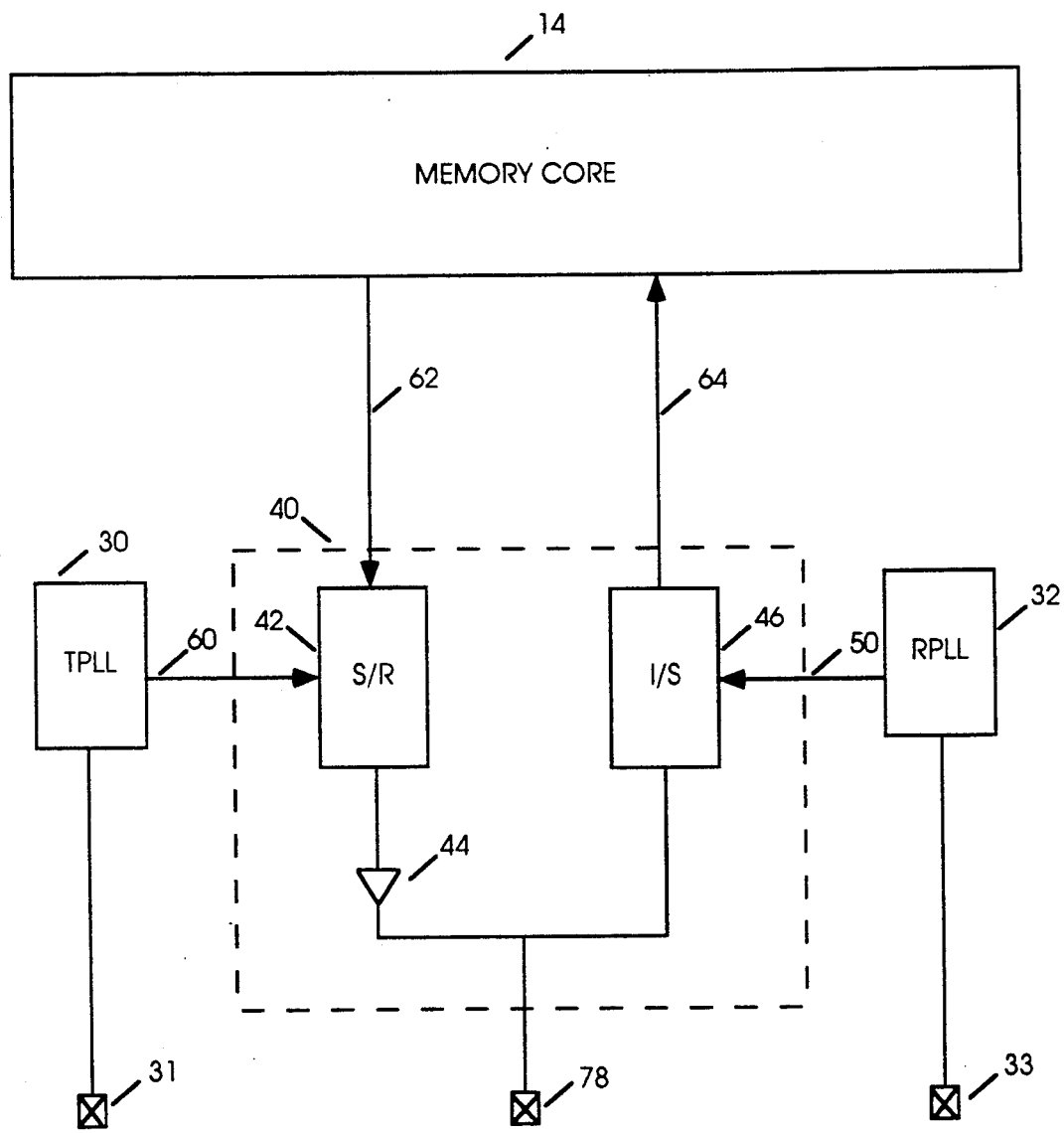
FIG. 6 illustrates the bus interface circuit, which is comprised of a receive clock phase locked loop circuit (PLL), a transmit clock PLL, and a set of substantially similar I/O circuits.

FIG. 6 illustrates the bus interface circuit 16, which is comprised of a receive clock phase locked loop circuit (PLL) 32, a transmit clock PLL 30, and a set of substantially similar I/O circuits, such as I/O circuit 40. The I/O circuits are coupled to transmit and receive over bus data pins 70-78 of the device 10 and the BC pin 79. The bus interface circuit 16 includes an I/O circuit for each of the bus data pins 70-78 and the BC pin 79.

The receive clock PLL 32 receives the RxCLK through the RxCLK pin 33, and generates an RCLK signal 50. To generate the RCLK signal 50, the receive clock PLL 32 converts the RxCLK from bus voltage levels of 1.7–2.5 V to on-chip voltage levels of 0–5 V. The receive clock PLL 32 also controls the phase relationship between the RxCLK and the RCLK 50.

The RECEIVE DATA signal is received over the bus data pins 70–78 by corresponding I/O circuits, such as the I/O circuit 40. The function of the I/O circuits is discussed below for the example I/O circuit 40, which corresponds to the bus data pin 78.

For the I/O circuit 40, an input sampler circuit (I/S) 46 is coupled to receive a bit of the RECEIVE DATA signal corresponding to the bus data pin 78. The I/S 46 samples the corresponding bit of the RECEIVE DATA signal on both the rising and falling edges of the RCLK 50. The receive clock PLL 32 delays the RCLK 50 relative to the RxCLK in order to compensate for the setup time of the I/S 46. The RCLK 50 delay ensures that the I/S 46 samples the corresponding bit of the RECEIVE DATA signal in the middle of the 2 ns bus cycle window. Thus, the combination receive clock PLL 32 and I/S 46 function as a zero delay sampler of the corresponding bit of the RECEIVE DATA signal.

After 8 samples of the corresponding bit of the RECEIVE DATA signal, the I/S 46 generates input data over signal lines 64 comprising the 8 sampled bits. The input data 64 is stored in the data array of the memory core 14.

A transmit clock PLL 30 is coupled to receive the TxCLK through the TxCLK pin 31. The transmit clock PLL 30 generates a TCLK signal 60 by converting the TxCLK from bus voltage levels of 1.7–2.5 V to chip voltage levels of 0–5 V. The transmit clock PLL 30 also controls the phase relationship between the TxCLK and the TCLK 60.

For the example I/O circuit 40, an output shift register circuit (S/R) 42 receives 8 bit wide parallel output data over signal lines 62 from the memory core 14 corresponding to the bus data pin 78. The S/R 42 shifts out the output data 62 one bit at a time to an output driver 44, which is coupled to transmit over the bus data pin 78. The S/R 42 generates a bit of the TRANSMIT DATA signal corresponding to the bus data pin 78 by shifting out a bit of the output data 62 on both the rising and falling edges of the TCLK signal 60. The corresponding bit of the TRANSMIT DATA signal is driven over the bus data pin 78 by the output the TRANSMIT DATA signal is driven over the bus data pin 78 by the output driver 44.

The transmit clock PLL 30 generates the TCLK 60 to compensate for the output delay of the S/R 42. The TCLK 60 ensures that the rising and falling edges of the TxCLK are centered in the middle of the 2 ns bus cycle window of the TRANSMIT DATA signal.

Figure 7:
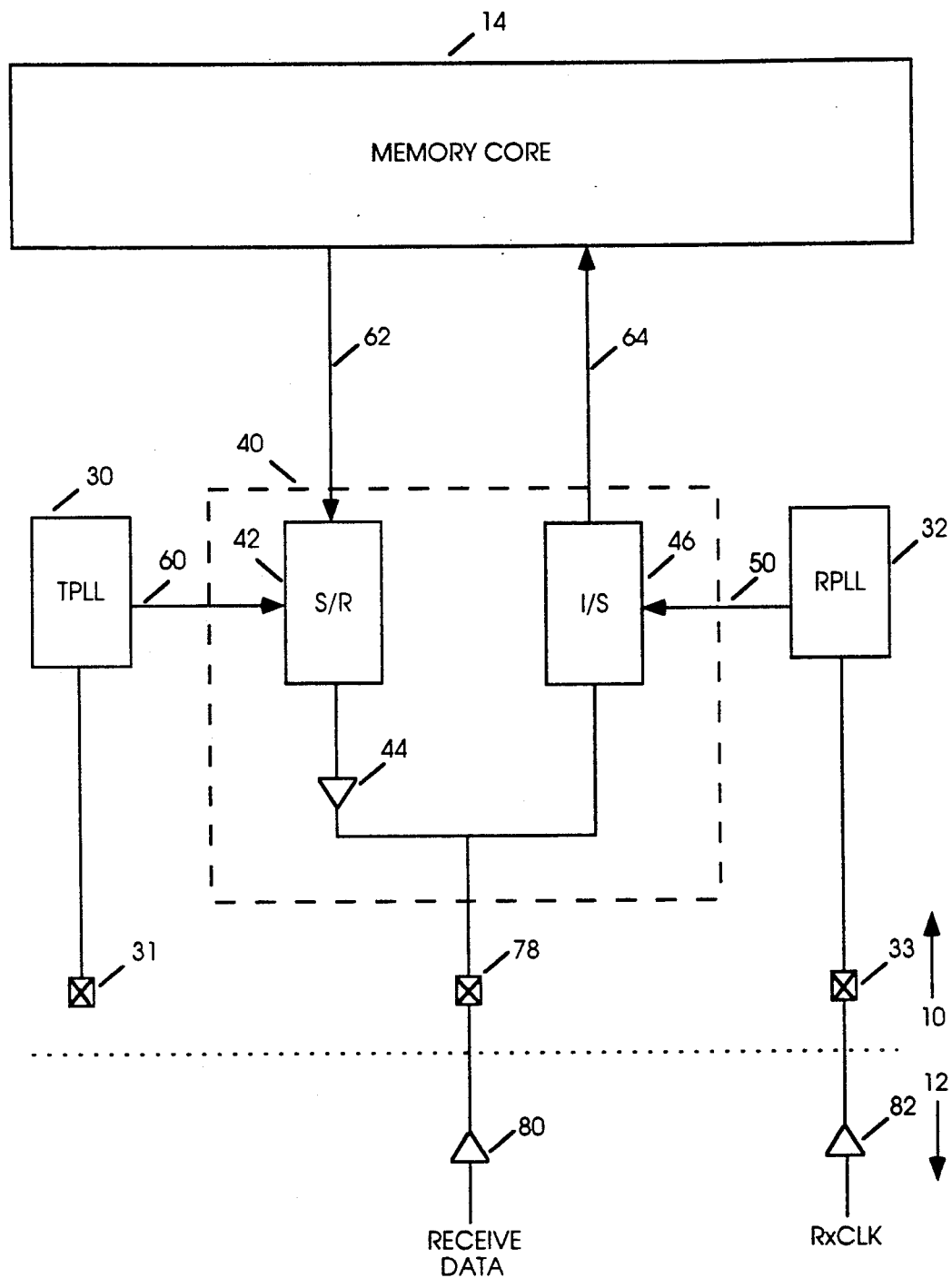
FIG. 7 illustrates an example timing test of the input parameters for the device using the tester.

FIG. 7 illustrates an example timing test of the input parameters for the device 10 using the tester 12. The tester 12 varies the timing of the RxCLK and the RECEIVE DATA signal to determine the minimum $t_{SU}$ and $t_H$ parameters for the device 10. The tester 12 generates the RxCLK through an output driver 82 and the RECEIVE DATA signal through an output driver 80. The RxCLK is coupled to the RxCLK bus pin 33, and the RECEIVE DATA signal is coupled to the bus data pin 78. For one embodiment, the tester 12 generates a one bit RECEIVE DATA signal for testing $t_{SU}$ and $t_H$ for the device 10.

To begin the input parameter test, the tester 12 transmits a request packet to initiate a write transaction targeted for the device 10. The tester 12 then transmits a write data block to the device 10, while adjusting the timing of the RxCLK and the RECEIVE DATA signal depending on the input parameter under test.

To test the $t_{SU}$ parameter for the device 10, the tester 12 advances the phase of the RxCLK relative to the RECEIVE DATA signal from the nominal timing. For one embodiment, the nominal $t_{SU}$ parameter for the device 10 is 1 ns. The phase relation between the RxCLK and the RECEIVE DATA signal is set according to a predetermined minimum measured $t_{SU}$ parameter for the device 10.

For example, is a minimum measured $t_{SU}$ parameter of 500 ps is required for the device 10, the tester 12 generates the RxCLK such that the rising and falling edges occur 500 ps after transitions of the RECEIVE DATA signal, rather than the 1 ns nominal timing.

To test the $t_H$ parameter for the device 10, the tester 12 delays the phase of the RxCLK relative to the RECEIVE DATA signal from the nominal timing. For one embodiment, the nominal $t_H$ parameter for the device 10 is 1 ns. The phase relation between the RxCLK and the RECEIVE DATA signal is set according to a predetermined minimum measured $t_H$ parameter for the device 10.

For example, if a minimum $t_H$ parameter of 500 ps is required for the device 10, the tester 12 generates the RxCLK such that the rising and falling edges occur 500 ps before the transitions of the RECEIVE DATA signal, rather than the 1 ns nominal timing.

The write data block contains an input parameter test pattern. If the $t_{SU}$ and $t_H$ input parameters for the device 10 are satisfied, the input parameter test pattern is properly stored in the memory core 14 by the bus interface circuit 16.

Thereafter, the tester 12 performs a read transaction with nominal timing to verify the input parameter test pattern. The tester 12 transmits a read request targeted for the device 10. The device 10 responds to the read request by accessing the memory core 14 and transmitting a read data block to the tester 12. The tester 12 receives the read data block and compares the read data block with the input parameter test pattern.

For one embodiment, it is preferable not to perform the input parameter test for all of the bus data pins 70–78. This is particularly true if the output pins of the tester 12 are carefully selected to improve the output accuracy. The input parameter test using the bus data pin 78 is sufficient to verify correct timing for the receive clock PLL 32. Because there is virtually no delay between the RCLK 50 generated by the receive clock PLL 32 and sampling of the RECEIVE DATA signal over the bus data pins 70–78, it may be assumed that all inputs have proper input parameter timing. This assumption is further verified during the $t_{CLK-Q}$ testing.

Figure 8:
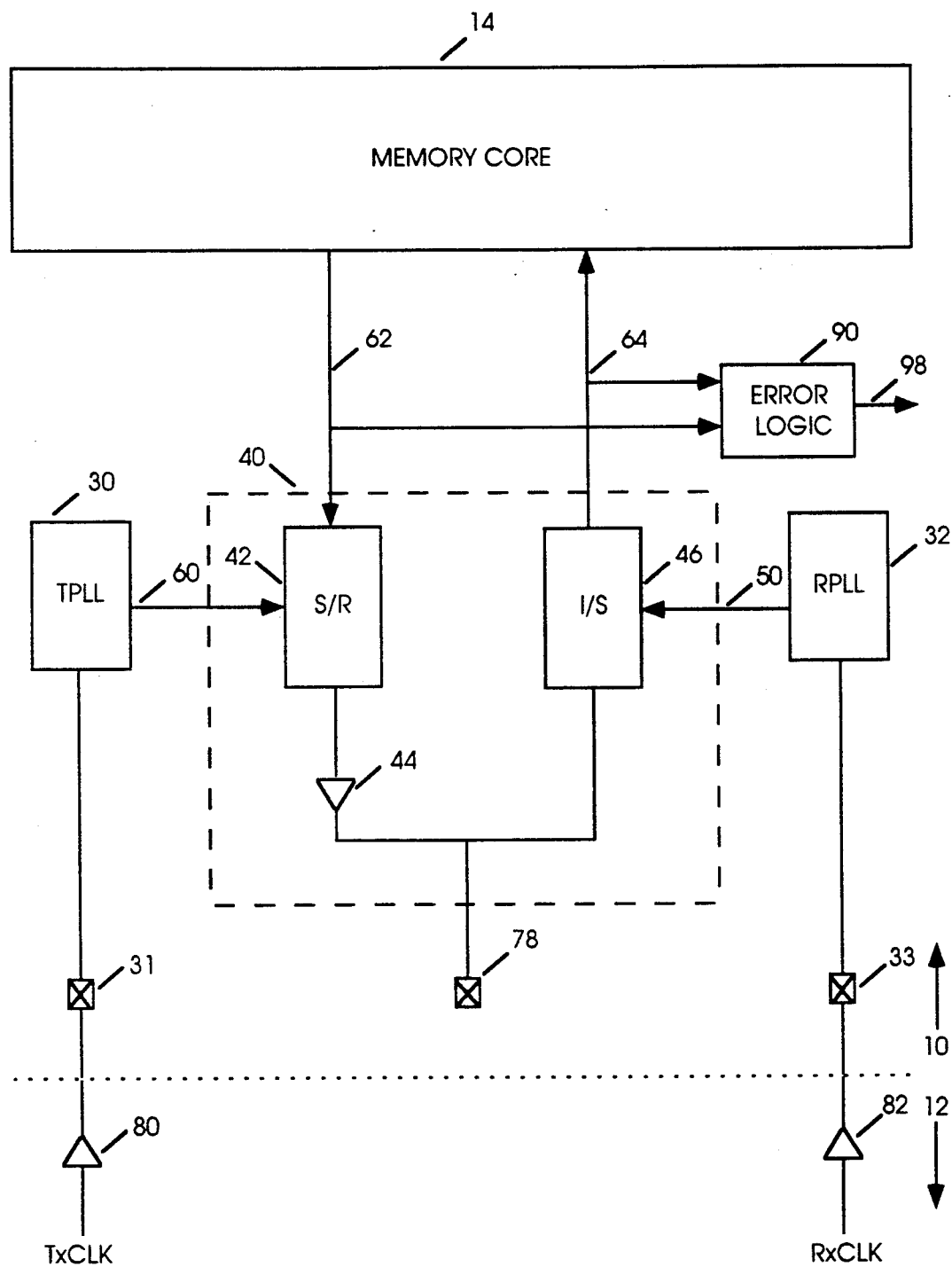
FIG. 8 illustrates an example timing test of the output parameter $t_{CLK-Q}$ for the device using the tester.

FIG. 8 illustrates a method for measuring the output parameter $t_{CLK-Q}$ for the device 10 using the tester 12. The method enables measurement of the output parameter for the device 10 without using the inputs 19 of the tester 12, thereby achieving a higher level of accuracy from the tester 12. The TxCLK is coupled through the output driver 80 of the tester 12 to the TxCLK bus pin 31. The RxCLK is coupled through the output driver 82 of the tester 12 to the RxCLK bus pin 33.

The bus interface circuit 16 contains an error logic circuit for each of the bus data pins 70–78, and for the BC pin 79. The error logic circuits are substantially similar. The function of the error logic circuits is discussed below for the error logic circuit 90, which corresponds to the bus data pin 78.

Figure 9:
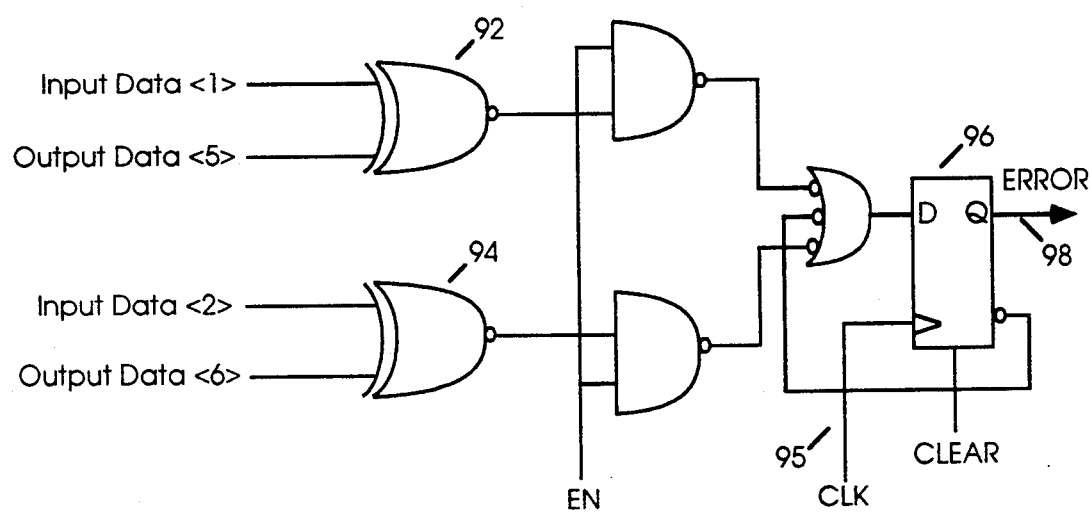
FIG. 9 is an illustration of the error logic circuit, which compares selected bits of the output data and the input data.

FIG. 9 is an illustration of the error logic circuit 90, which compares selected bits of the output data 62 and the input data 64. An XNOR gate 92 compares bit 1 of the input data 64 with bit 5 of the output data 62. An XNOR gate 94 compares bit 2 of the input data 64 with bit 6 of the output data 62. The I/S 46 is comprised of an even bus cycle sampler and an odd bus cycle sampler. The even bus cycle sampler latches data on the rising edge of the RCLK 50 and the odd bus cycle sampler latches data on the falling edge of the RCLK 50. The XNOR gate 94 tests the even cycle bus sampler, and the XNOR gate 92 tests the odd cycle bus sampler.

If the selected bits of the input data 64 and the output data 62 differ, the CLK signal 95 latches a "1" into an error flip flop 96. An error bit 98 indicates an error detected between the selected bits of the input data 64 and the output data 62. Thereafter, the error flip-flop 96 latches the error bit 98 back into the error flip flop 96 on each CLK signal 95.

The error bits corresponding to the bus data pins 70–78 and the BC pin 79 are stored in registers mapped to the register space of the device 10. The error bits are cleared by writing to error registers in the register space of the device 10.

To begin the $t_{CLK-Q}$ parameter test, the tester 12 transmits a request packet to initiate a write transaction targeted for the device 10. The tester 12 then transmits a write data block containing an output parameter test pattern to the device 10. The output parameter test data pattern is transmitted with nominal input parameter timing. For one embodiment, the output parameter test pattern comprises 64 data bytes. Thereafter, tester 12 resets the error bits by writing to the error registers.

To test the $t_{CLK-Q}$ output parameter, the tester 12 transmits a request packet to initiate a block read transaction targeted for the output parameter test pattern stored in the device 10. In response, the output parameter test pattern is transferred out of the memory core 14 and transmitted over the bus data pins 70–78 through the I/O circuits. The output parameter test pattern is transmitted out of the I/O circuits synchronized by the rising and falling edges of the TxCLK, as previously described.

As the tester 12 generates the TxCLK to synchronize the transmission of the output parameter test pattern, the tester 12 also generates the RxCLK to cause the I/O circuits to sample the data on the bus data pins 70–78. The tester 12 adjusts the phase relationship of the RxCLK and the TxCLK to test the minimum $t_{CLK-Q}$ output time. The error logic circuits compare the data transmitted over the data pins 70–78 with the expected output parameter test pattern. If an error is detected, the appropriate error bit is set.

The functions of the I/O circuits and error logic circuits corresponding to the bus data pins 70–78 for the output parameter test are substantially similar. The functions are described below for the example I/O circuit 40 and the error logic circuit 90, which correspond to the bus data pin 78.

The bits of the output parameter test pattern corresponding to the bus data pin 78 are transferred out of the memory core 14 over the output data signal lines 62 8 bits at a time. The S/R 42 shifts out the bits of the output data 62 on both the rising and falling edges of the TCLK 60, which is derived from the TxCLK generated by the tester 12. As the bits of the output data 62 are transmitted over the bus data pin 78, the I/S 46 samples the bus data pin 78. The I/S 46 samples the bus data pin 78 on both the rising and falling edges of the RCLK 50, which is derived from the RxCLK generated by the tester 12.

The I/S 46 generates the input data over signal lines 64 after 8 samples of the bus data pin 78. Thereafter, the error logic circuit 90 compares the selected bits of the input data 64 and the output data 62. If the selected bits do not match, the error bit 98 is set.

The tester 12 advances the phase of the RxCLK relative to the TxCLK to test the minimum $t_{CLK-Q}$ output time for the device 10. If the phase of the RxCLK is advanced relative to the TxCLK such that the input samplers of the I/O circuits sample invalid data on the bus data pins 70–78, then the appropriate error logic circuits detect the error. Thereafter, the tester 12 reads the error bits of the device 10 to determine if the minimum $t_{CLK-Q}$ output time for the device 10 was violated.

FIG. 10 shows a bit table of an example output parameter test pattern that corresponds to the bus data pin 78. The table contains 64 bits corresponding to bus cycles 0–63 that are transmitted over the bus data pin 78 when the output parameter test pattern is read by the tester 12. Also indicated are the output data 62 bits 1 and 2 and the input data 64 bits 5 and 6, which are compared by the error logic circuit 90.

The bits of the output parameter test pattern are arranged such that the output data bits are used to test the input data bits through the error logic circuit 90. During a read of the output parameter test pattern, bits 0–7 of the output parameter test pattern are received by the S/R 42, and transmitted over the bus pin 78 while being sampled by the I/S 46. Bits 0–7 are transferred to the memory core 14 over signal lines 64, while bits 8–15 of the output parameter test pattern are received by the S/R 42 over signal lines 62.

Thus, bits 0–7 of the output parameter test pattern are valid on the input data 64 at the same time bits 8–15 of the output parameter test pattern are valid on the output data 62. The XNOR gate 92 compares bits 13 and 1 of the output parameter test pattern. Similarly, the XNOR gate 94 compares bit 14 and 2 of the output parameter test pattern.

Alternatively, the output data over signal lines 62 may be transferred through a delay circuit to the error logic circuit 90. The delay circuit compensates for the pipeline delay between the output data over the signal lines 62 and the input data over signal lines 64.

For one embodiment, the XNOR gates 92 and 94 require that the input data be the complement of the output data to not indicate an error. As a consequence, the output parameter test pattern is arranged such that the output data is the complement of the input data. For example, bit 13 is the complement of bit 1, and bit 14 is the complement of bit 2.

The bits of the output parameter test pattern not used for comparison by the error logic circuit 90 are used to condition the output driver 44 for the output parameter test. The bits condition the output driver 44 with varying sequences of logic levels prior to driving out the output data bits over the bus data pin 78.

For one embodiment, the measurement of the output parameter $t_{CLK-Q}$ for the bus data pins 70–78 further validates the measurement of the input parameters $t_{SU}$ and $t_H$ for the bus data pins 70–78 because the input samplers are used on all I/O pins to capture the driven data.

One possible problem with using the input samplers to measure the $t_{CLK-Q}$ timing is that a systematic error in the generation of the TCLK 60 and the RCLK 50 signals, such as TCLK 60 offset in the same direction as RCLK 50 offset, could result in the output parameter test passing with invalid output parameters. However, because the RCLK 50 phase is independently checked during input parameter testing, this error condition will be detected.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method for testing clock to output time for an integrated circuit device, comprising the steps of:
   (a) storing an output parameter test pattern in the integrated circuit device;
   (b) generating a receive clock and a transmit clock using a pair of output pins of an integrated circuit tester;
   (c) coupling the transmit clock to a transmit clock input of the integrated circuit device, such that the transmit clock causes the integrated circuit device to generate an output data bit stream by transmitting the output parameter test pattern over a bus data pin;
   (d) coupling the receive clock to a receive clock input of the integrated circuit device, such that the receive clock causes the integrated circuit device to generate an input data pattern by sampling the output data bit stream on the bus data pin;
   (e) adjusting the phase relation between the transmit clock and the receive clock, and comparing the input data pattern with the output data bit stream to determine the clock to output time.

2. The method of claim 1, wherein the pair of output pins of the integrated circuit tester are pre-selected from among a plurality of available output pins of the integrated circuit to maximize an output accuracy between the pair of output pins, the output accuracy specifying an uncertainty in a relative phase difference between the receive clock and the transmit clock on the pair of output pins.

3. The method of claim 1, wherein step (e) comprises the step of advancing the phase of the receive clock relative to the transmit clock and comparing the input data pattern with the output data bit stream to determine the clock to output time for the integrated circuit device.

4. The method of claim 1, wherein the output parameter test pattern comprises a set of data bits including a set of drive bits and a set of test bits.

5. The method of claim 4, wherein the step of comparing the input data pattern with the output data bit stream in step (e) comprises the step of comparing the drive data bits with the test data bits.

* * * * *